United States Patent
Qu et al.

(10) Patent No.: US 10,283,376 B2
(45) Date of Patent: May 7, 2019

(54) CHIP ENCAPSULATING METHOD AND CHIP ENCAPSULATING STRUCTURE

(71) Applicants: BOE TECHNOLOGY GROUP CO., LTD., Beijing (CN); Beijing BOE Display Technology Co., Ltd., Beijing (CN)

(72) Inventors: Lianjie Qu, Beijing (CN); Yun Qiu, Beijing (CN); Dan Wang, Beijing (CN); Hebin Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/951,267

(22) Filed: Apr. 12, 2018

(65) Prior Publication Data

US 2019/0006195 A1  Jan. 3, 2019

(30) Foreign Application Priority Data

Jul. 3, 2017  (CN) .......................... 2017 1 0536547

(51) Int. Cl.
- *H01L 21/56* (2006.01)
- *H01L 23/00* (2006.01)
- *H01L 23/31* (2006.01)

(52) U.S. Cl.
CPC .......... *H01L 21/561* (2013.01); *H01L 21/568* (2013.01); *H01L 23/3114* (2013.01); *H01L 24/11* (2013.01); *H01L 2224/0231* (2013.01); *H01L 2224/04105* (2013.01); *H01L 2224/12105* (2013.01); *H01L 2224/19* (2013.01); *H01L 2224/96* (2013.01); *H01L 2924/18162* (2013.01)

(58) Field of Classification Search
None
See application file for complete search history.

(56) References Cited

U.S. PATENT DOCUMENTS

2016/0093580 A1*  3/2016  Scanlan .................. H01L 23/48
257/737

FOREIGN PATENT DOCUMENTS

| CN | 104733379 A | 6/2015 |
| CN | 105448752 A | 3/2016 |
| CN | 106233460 A | 12/2016 |

OTHER PUBLICATIONS

'Fabrication: Mold-First & RLD-First Approach for High Density FO-WLP', Institute for Microelectronics, Apr. 22, 2014, downloaded from URL<https://www.a-star.edu.sg/Portals/30/Users/139/39/139/IME%27s%20HD%20FO-WLP%20Consortium%20Project-Fabrication-22%20Apr%2014.pdf> on Oct. 3, 2018.*

(Continued)

*Primary Examiner* — J. E. Schoenholtz
(74) *Attorney, Agent, or Firm* — Calfee, Halter & Griswold LLP

(57) ABSTRACT

A chip encapsulating method includes: fixing a plurality of wafers to a first panel level substrate, the wafer including a plurality of chips; forming a re-distribution layer on the wafer for each of the chips; forming each individual chip and the re-distribution layer connected to the chip by cutting; fixing the chip and the re-distribution layer connected thereto to a second panel level substrate; and encapsulating the chip to form an encapsulating layer. A chip encapsulating structure is prepared by the above described chip encapsulating method.

18 Claims, 7 Drawing Sheets

(56) References Cited

OTHER PUBLICATIONS

"FOWLP & Embedded die Packages", Yole Development, 2012.*
Lapedus, M.,"Inside Panel-Level Fan-Out Technology", Semiconductor Engineering, Sep. 11, 2017 downloaded from URL<https://semiengineering.com/inside-panel-level-fan-out-technology/ on Oct. 2, 2018.*
Braun, T., et al. "From Fan-out Wafer to Fan-out Panel Level Packaging." 2015 European Conference on Circuit Theory and Design (ECCTD), 2015, doi:10.1109/ecctd.2015.7300046.*
Vardaman, E. Jan, "The Movement to Large Array Packaging: Opportunities and Options", TechSearch International, 2015.*
First Office Action for Chinese Patent Application No. 201710536547.7 dated Dec. 21, 2018.

* cited by examiner

A-A'

CHIP ENCAPSULATING METHOD AND CHIP ENCAPSULATING STRUCTURE

CROSS REFERENCE

The present application claims the priority of Chinese Patent Application No. 201710536547.7, titled "Chip encapsulating method and chip encapsulating structure", and filed on Jul. 3, 2017, and the entire contents thereof are incorporated herein by reference.

TECHNICAL FIELD

The present disclosure relates to the field of semiconductor technology, and in particular, to a chip encapsulating method and a chip encapsulating structure.

BACKGROUND

With the continuous development of integrated circuit technology, electronic products are becoming smaller, more intelligent, and more highly reliable. In contrast, encapsulating of the integrated circuit directly affects the performance of integrated circuits, electronic modules, and even the entire machine. As the gradually shrinking of the integrated circuit wafers and continuous improvement of the integration level, higher and higher requirements have been placed on encapsulating of the integrated circuit.

The chip encapsulating of the traditional semiconductor industry mainly includes the following processes: cutting chips on the wafer into individual chips, re-arranging qualified chips on the substrate in a regular manner, and then performing encapsulating and forming a re-distribution layers (RDLs) and solder balls.

However, due to the small size of the substrate used in the semiconductor industry, generally 6 inches, 8 inches, and 12 inches, the output scale after being encapsulated is limited.

SUMMARY

Embodiments of the present disclosure adopt following technical solutions.

In one aspect, there is provided a chip encapsulating method, including: fixing a plurality of wafers to a first panel level substrate, the wafer including a plurality of chips; forming a re-distribution layer on the wafer for each of the chips; forming each individual chip and the re-distribution layer connected to the chip by cutting; fixing the chip and the re-distribution layer connected thereto to a second panel level substrate; and encapsulating the chip to form an encapsulating layer.

In an exemplary embodiment, when the chip and the re-distribution layer connected thereto are fixed to the second panel level substrate, the re-distribution layer is close to the second panel level substrate. Based on this, after the chip is encapsulated, the chip encapsulating method further includes: removing the second panel level substrate; fixing the encapsulating layer to a third panel level substrate, and forming a solder ball on one side of the re-distribution layer.

In an exemplary embodiment, when the chip and the re-distribution layer connected thereto are fixed to the second panel level substrate, the re-distribution layer is close to the second panel level substrate. Based on this, after the chip is encapsulated, the chip encapsulating method further includes: cutting the encapsulating layer, to form each individual chip encapsulating body; forming a solder ball for each of the chip encapsulating body.

In an exemplary embodiment, when the chip and the re-distribution layer connected thereto are fixed to the second panel level substrate, the re-distribution layer is away from the second panel level substrate. Based on this, after the chip is encapsulated, the chip encapsulating method further includes: decapsulating the encapsulating layer, to expose a contact portion of the re-distribution layer contacting the solder ball; and forming the solder ball.

In an exemplary embodiment, after the re-distribution layer is formed and before forming each individual chip and the re-distribution layer connected to the chip by cutting, the method further includes: removing the first panel level substrate.

In an exemplary embodiment, a shape of the wafer is a regular polygon; and a plurality of the wafers is seamlessly arranged on the first panel level substrate.

In an exemplary embodiment, the wafer has a rectangular or regular hexagon shape.

In an exemplary embodiment, the second panel level substrate is a tempered glass substrate.

In an exemplary embodiment, the first panel level substrate and the second panel level substrate have an identical size.

In an exemplary embodiment, the third panel level substrate and the first panel level substrate, the second panel level substrate have an identical size when the encapsulating layer is fixed to the third panel level substrate.

In another aspect, there is provided a chip encapsulating structure, which may be prepared by any one of the above chip encapsulating methods.

BRIEF DESCRIPTION OF THE DRAWINGS

In order to more clearly describe the technical solutions in the embodiments of the present disclosure or in the prior art, the drawings used in the description of the embodiments or the prior art will be briefly described below. Obviously, the drawings in the following description are only some embodiments of the present disclosure, those skilled in the art can also obtain other drawings based on these drawings without any creative work.

FIG. 2b is a schematic sectional view taken along line AA' in FIG. 2a;

DETAILED DESCRIPTION

The following will clearly and completely describe the technical solutions in the embodiments of the present disclosure with reference to the accompanying drawings in the embodiments of the present disclosure. It is obvious that the described embodiments are merely a part of the embodiments of the present disclosure, but not all of the embodiments. All other embodiments obtained by a person of ordinary skill in the art based on the embodiments of the present disclosure without creative efforts shall fall within the protection scope of the present disclosure.

Figure 1:
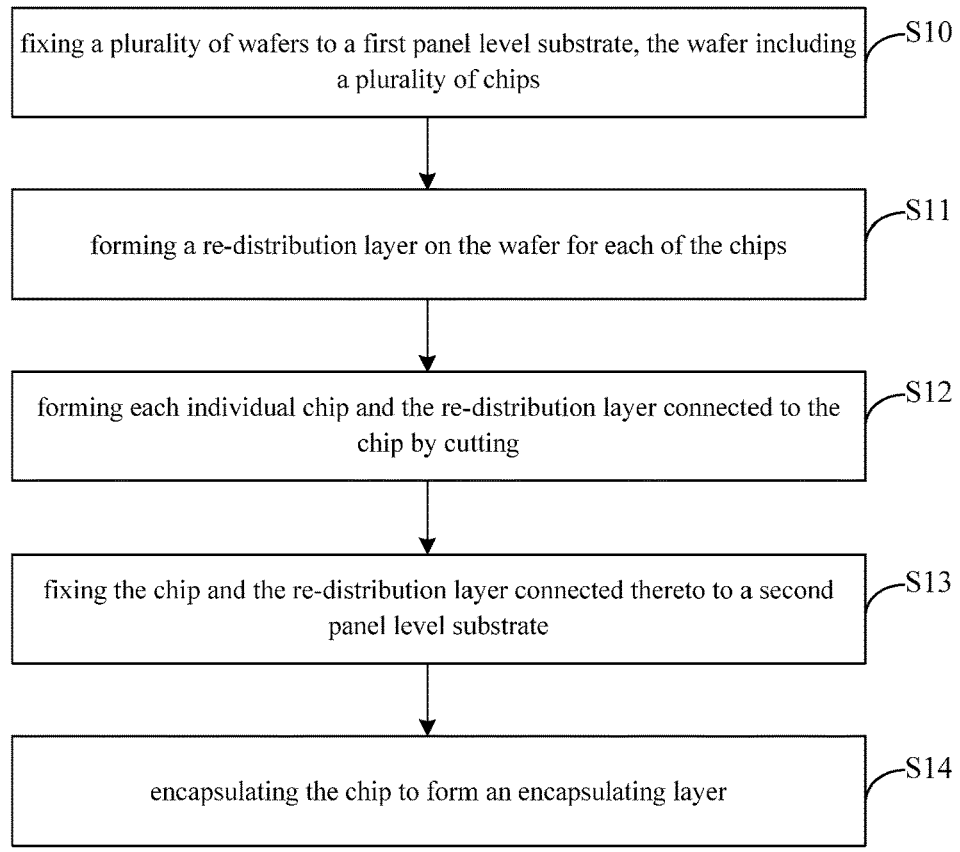
FIG. 1 is a schematic flowchart of a chip encapsulating method provided by the present disclosure.

A chip encapsulating method is provided by an embodiment of the present disclosure, as shown in FIG. 1, including following steps.

Figure 2A:
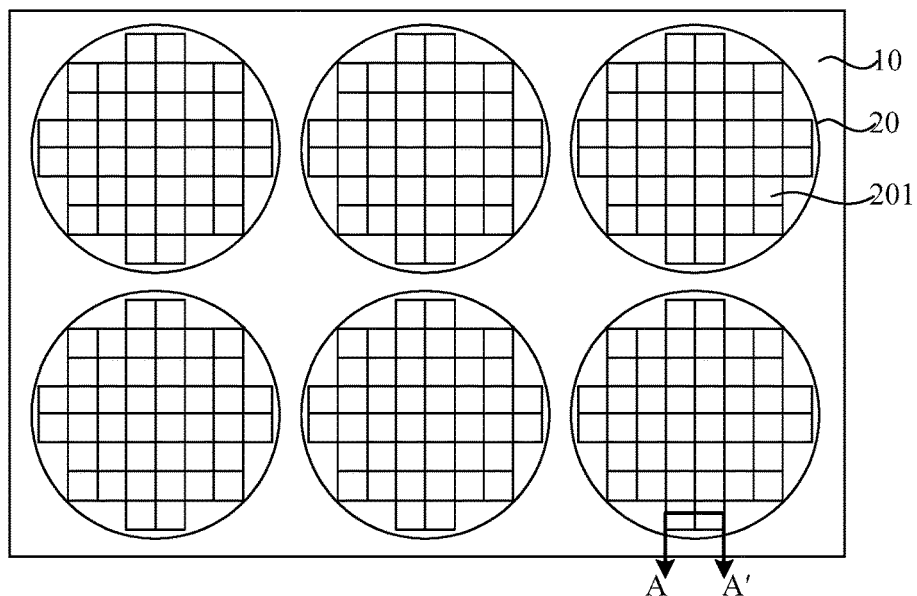
FIG. 2a is a schematic diagram of fixing a plurality of wafers to a first panel level substrate provided by the present disclosure.
Figure 2B:
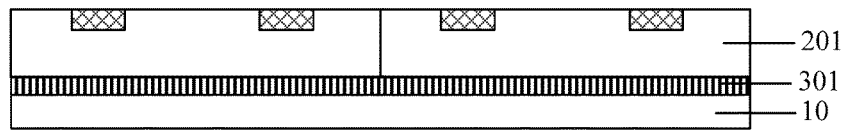

In the step of S10, as shown in FIGS. 2a and 2b, a plurality of wafers 20 is fixed to a first panel level substrate 10, and the wafer 20 includes a plurality of chips 201.

In the embodiment, the wafer 20 is fixed to the first panel level substrate 10 through a first adhesive layer 301. The wafer 20 may be, for example, a silicon wafer.

The first panel level substrate 10 is a large-sized substrate used in the panel industry, for example, a substrate of 1100 mm×1300 mm, a substrate of 2200 mm×2500 mm, and the like.

The chip 201 may include a semiconductor device or an integrated circuit which has been manufactured on a semiconductor substrate. For example, chip 201 may include a substrate containing silicon or other semiconductor material, an insulating layer on the substrate, conductive parts (including, for example, metal pads, plugs, through holes, or wires), and contact pads on the conductive parts.

Figure 3:
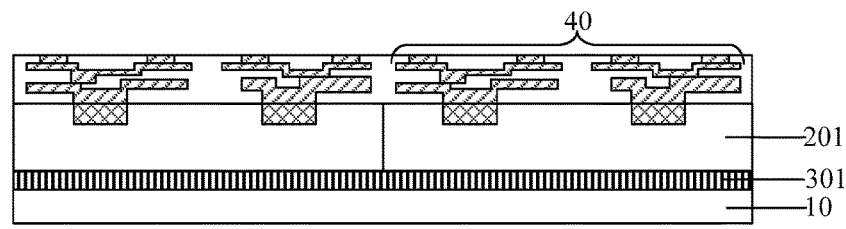
FIG. 3 is a schematic view of the wafer after forming a re-distribution layer.

In the step of S11, as shown in FIG. 3, re-distribution layers (RDLs) 40 are formed on the wafer 20 for each of the chips 201.

The re-distribution layer 40 is electrically connected to the contact pads on the chip 201. The re-distribution layer 40 may be formed in the dielectric layer, which includes metal wires such as copper, copper alloy, and the like, and may be formed through process steps such as thin film deposition, exposure and development, and etching or the like.

Since chips 201 on each wafer 20 are independent from each other, re-distribution layers 40 of each chip 201 should be also independent and insulated from each other when the re-distribution layer 40 is formed. Specifically, the isolation can be performed through a dielectric layer, to ensure insulation between the chips 201.

The re-distribution layer 40 realizes the step-by-step amplification of the leads of the chip 201, thereby realizing the nanometer-to-micron-scale conversion of the leads of the chip 201. When pins of the chip 201 reach a micrometer level, they can be accurately butt jointed with other devices.

Figure 4:
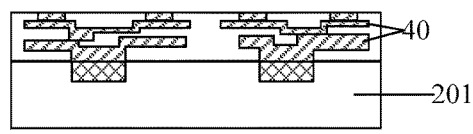
FIG. 4 is a schematic view of forming each individual chip and a re-distribution layer connected to the chip after being cut on the basis of FIG. 3.

In the step of S12, as shown in FIG. 4, each individual chip 201 and the re-distribution layer 40 connected to the chip 201 are formed by cutting.

When each wafer 20 includes N chips 201 and M wafers 20 are disposed on the first panel level substrate 10, after cutting, M×N independent chips 201 may be obtained, where M and N are positive integer. Of course, the re-distribution layer 40 connected to each chip 201 may also be separated from the re-distribution layer 40 connected to different chip 201 by cutting the surrounding dielectric layer.

Figure 5:
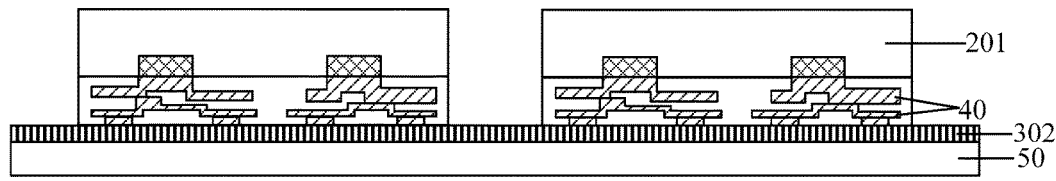
FIG. 5 is a schematic diagram of fixing a chip and a re-distribution layer connected thereto to a second panel level substrate on the basis of FIG. 4.
Figure 6:
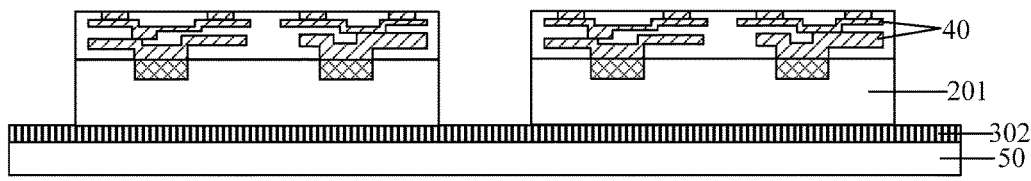
FIG. 6 is another schematic diagram of fixing a chip and a re-distribution layer connected thereto to a second panel level substrate on the basis of FIG. 4.

In the step of S13, as shown in FIG. 5 or FIG. 6, the chip 201 and the re-distribution layer 40 connected thereto are fixed to a second panel level substrate 50.

After M×N individual chips 201 are obtained by cutting, each chip 201 can be tested, to select qualified chips 201 to be rearranged on the second panel level substrate 50.

Similar to the first panel level substrate 10, the second panel level substrate 50 is also a large substrate used by the panel industry.

The chip 201 and the re-distribution layer 40 connected thereto can be fixed to the second panel level substrate 50 through a second adhesive layer 302.

It should be noted that when the chip 201 and the re-distribution layer 40 connected thereto are fixed to the second panel level substrate 50, it may be the case that the re-distribution layer 40 is close to the second panel level substrate 50, or the chip 201 is close to the second panel level substrate 50.

Figure 7:
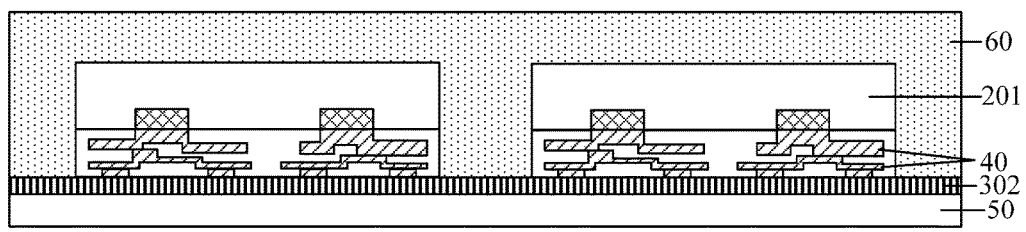
FIG. 7 is a schematic view after forming an encapsulating layer on the basis of FIG. 5.
Figure 8:
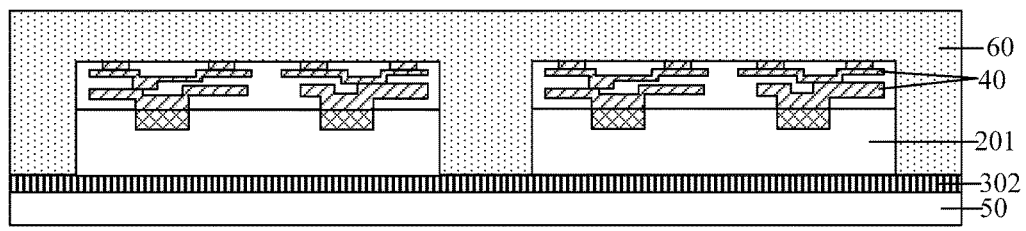
FIG. 8 is a schematic view after forming an encapsulating layer on the basis of FIG. 6.

In the step of S14, as shown in FIG. 7 or FIG. 8, the chip 201 is encapsulated to form an encapsulating layer 60.

The encapsulating layer 60 serves to protect the chip 201.

It should be noted that, those skilled in the art should understand that after the chip 201 is encapsulated, solder balls need to be formed further in order to achieve the butt joint with other devices, which will not be described in detail herein.

An embodiment of the present disclosure provides a chip encapsulating method. By fixing a plurality of wafers 20 on a first panel level substrate 10 first, a large-area exposure can be performed on a production line of a panel field, so that etching is performed to from a re-distribution layer 40 for each chip, and the accuracy of the metal wire in the re-distribution layer 40 can be ensured. Then each individual chip 201 and the re-distribution layer 40 connected to the chip 201 are obtained by cutting, and the chip 201 and the re-distribution layer 40 connected to the chip 201 are rearranged on the second panel level substrate 50, which may achieve the encapsulation of the chips 201 arranged on the second panel level substrate 50 at the same time. Since the entire encapsulating process is carried out in the production line of the panel field, large-scale encapsulating can be realized, the encapsulating efficiency and the yield efficiency are improved, and the encapsulating cost of the traditional semiconductor industry is reduced.

Figure 9:
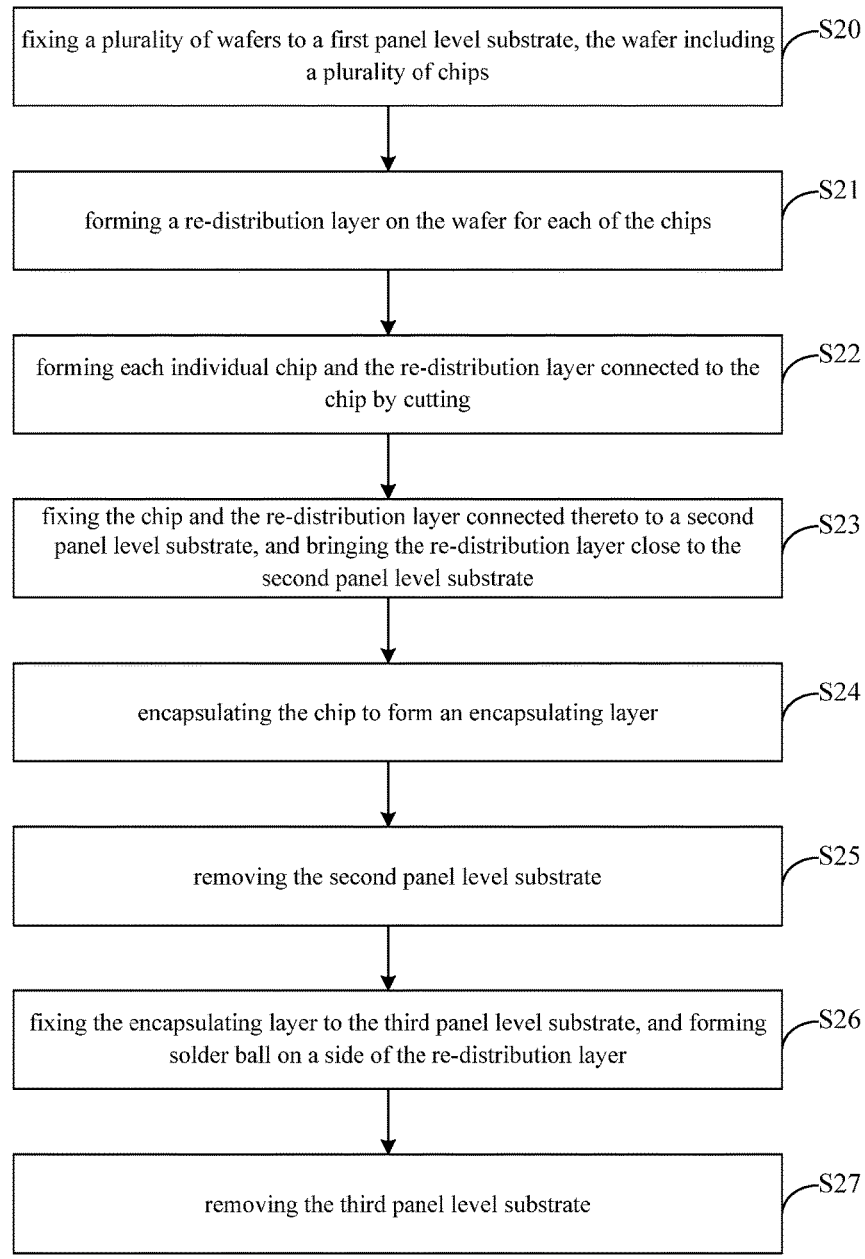
FIG. 9 is another schematic flowchart 1 of a chip encapsulating method provided by the present disclosure.

According to the first embodiment, a chip encapsulating method is provided. As shown in FIG. 9, the method includes following steps.

In the step of S20, as shown in FIGS. 2a and 2b, a plurality of wafers 20 is fixed to a first panel level substrate 10, and the wafer 20 includes a plurality of chips 201.

In the embodiment, the wafer 20 is fixed to the first panel level substrate 10 through a first adhesive layer 301.

In the step of S21, as shown in FIG. 3, re-distribution layers 40 are formed on the wafer 20 for each of the chips 201.

In the step of S22, as shown in FIG. 4, each individual chip 201 and the re-distribution layer 40 connected to the chip 201 are formed by cutting.

To avoid damaging the first panel level substrate 10 during the cutting to reuse the first panel level substrate 10, the first panel level substrate 10 may be removed first after S21 and before S22.

In the embodiment, an appropriate method may be selected according to the material of the first adhesive layer 301, to separate the first adhesive layer 301 from the chip 201, to remove the first panel level substrate 10.

The material of the first adhesive layer 301 may be, for example, a double-side adhesive. In this case, viscosity of the double-sided adhesive may be reduced by heating, to achieve separation from the chip 201, to remove the first panel level substrate 10. Alternatively, the material of the first adhesive layer 301 may be, for example, a UV adhesive glue. In this case, viscosity of the UV adhesive glue may be reduced by UV light, to achieve separation from the chip 201, to remove the first panel level substrate 10.

In the step of S23, as shown in FIG. 5, the chip 201 and the re-distribution layer 40 connected thereto are fixed to a second panel level substrate 50, and the re-distribution layer 40 is brought close to the second panel level substrate 50.

In the embodiment, the chip 201 and the re-distribution layer 40 connected thereto are fixed to the second panel level substrate 50 by the second adhesive layer 302.

The chip 201 fixed to the second panel level substrate 50 should be a qualified chip 201 after being tested.

In the step of S24, as shown in FIG. 7, the chip 201 is encapsulated, to form an encapsulating layer 60.

Since the sealing property of an epoxy molding compound (EMC) is good and plastic molding is easy, the material of the encapsulating layer 60 is preferably EMC.

In the embodiment, EMC uses epoxy resin as matrix resin, phenolic resin as curing agent, and some fillers, such as fillers, flame retardants, colorants, coupling agents and other micro components are added. The epoxy ring opening of the epoxy resin reacts with the phenolic resin under the effect of the heat and curing agent, to produce a cross-linking curing effect to make it a thermosetting plastic.

Figure 10:
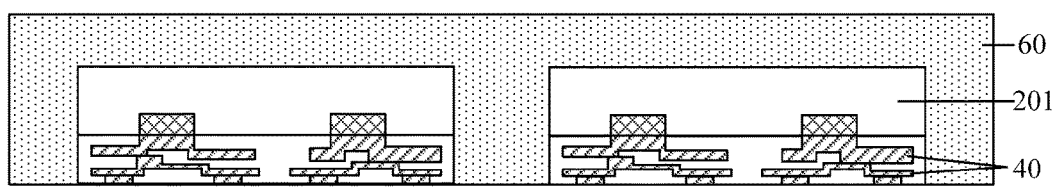
FIG. 10 is a schematic diagram after removing the second panel level substrate on the basis of FIG. 7.

In the step of S25, as shown in FIG. 10, the second panel level substrate 50 is removed.

The method of removing the second panel level substrate 50 is similar to that of removing the first panel level substrate 10, and details are not described herein again.

Figure 11:
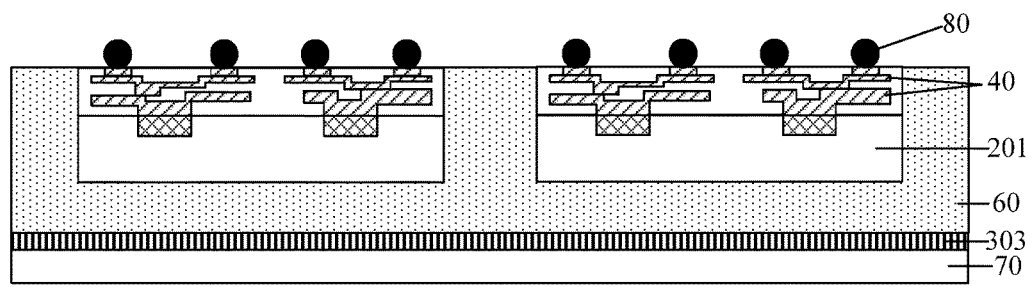
FIG. 11 is a schematic diagram of after fixing the encapsulating layer to the third panel level substrate and forming a solder ball on the basis of FIG. 10.

In the step of S26, as shown in FIG. 11, the encapsulating layer 60 is fixed to the third panel level substrate 70, and solder balls 80 are formed on a side of the re-distribution layer 40.

That is, after the second panel level substrate 50 is removed, the entirety of the chip 201, the re-distribution layer 40, and the encapsulating layer 60 are reversed, so that the encapsulating layer 60 faces the third panel level substrate 70 and is fixed to the third panel level substrate 70.

The encapsulating layer 60 is fixed to the third panel level substrate 70 through a third adhesive layer 303.

Figure 12:
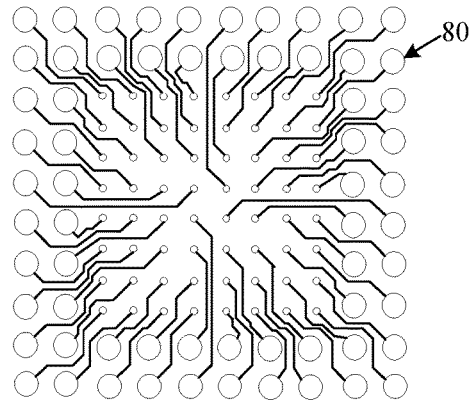
FIG. 12 is a schematic top view of a solder ball arranged in a ball grid array provided by the present disclosure.

As shown in FIG. 12 the solder balls 80 are arranged in a ball grid array (BGA).

The solder ball 80 is a metal material including tin, lead, copper, silver, gold, tantalum, and other metals or alloys thereof. Methods of forming solder balls 80 include printing, ball placement, laser sintering, electroplating, electroless plating, sputtering, and the like.

Figure 13:
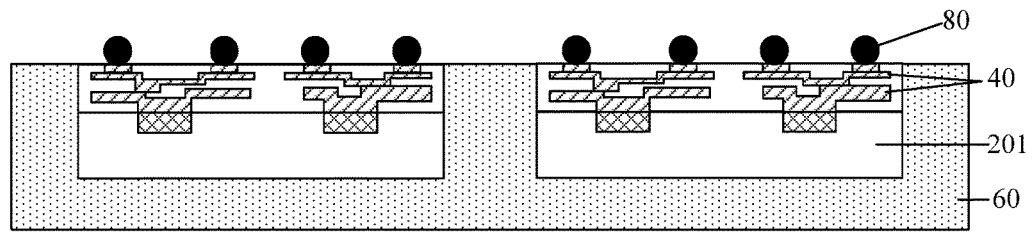
FIG. 13 is a schematic view after the third panel level substrate is removed on the basis of FIG. 11.

In the step of S27, as shown in FIG. 13, the third panel level substrate 70 is removed.

The method of removing the third panel level substrate 70 is similar to that of removing the first panel level substrate 10, which will not be described again here.

In the embodiment, after the third panel level substrate 70 is removed, the encapsulating layer 60 may be cut to obtain each individual encapsulated chip. The encapsulating layer 60 may also be cut first to obtain each individual encapsulated chip, and then the third panel level substrate 70 may be removed.

In the embodiment of the present disclosure, a plurality of chips 201 and a re-distribution layer 40 connected to each chip 201 are fixed to the second panel level substrate 50, and the plurality of chips 201 is encapsulated simultaneously. Then the plurality of encapsulated chips 201 is fixed to the third panel substrate 70, and a large-area solder ball 80 may be manufactured.

The second embodiment provides a chip encapsulating method. The difference from the Embodiment 1 lies in that, after S20-S24, the encapsulating layer 60 is cut first to form each individual chip encapsulating body. In the embodiment, the chip encapsulating body includes one chip 201, a re-distribution layer 40 connected to the chip 201, and the encapsulating layer 60 for encapsulating the chip 201. After that, solder balls 80 are formed for each chip encapsulating body.

In the embodiment, the solder balls 80 may be formed by spot welding each chip encapsulating body by a picker.

Figure 14:
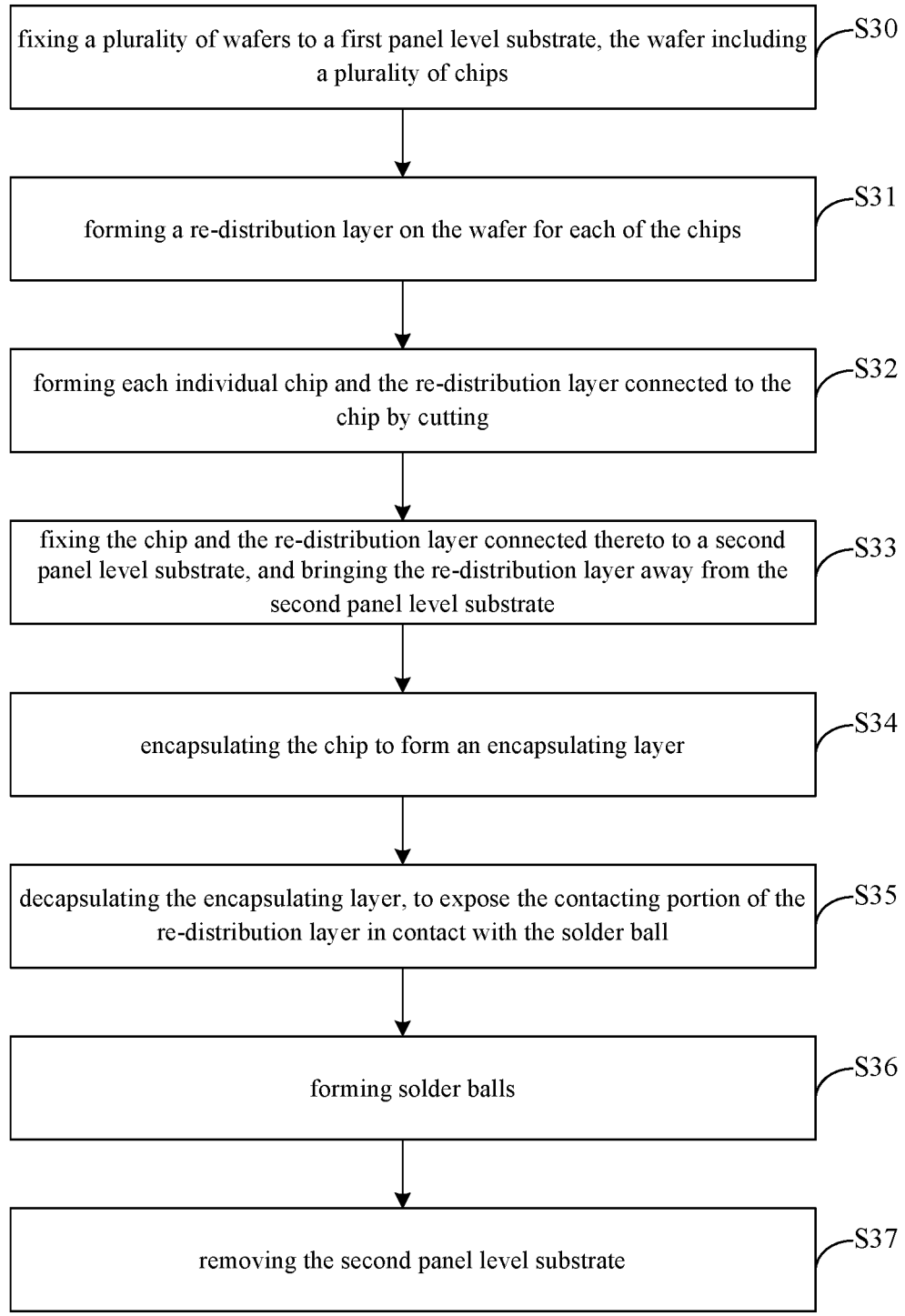
FIG. 14 is still another schematic flowchart 1 of a chip encapsulating method provided by the present disclosure.

The third embodiment provides a chip encapsulating method. As shown in FIG. 14, the method includes following steps.

In the step of S30, as shown in FIGS. 2a and 2b, a plurality of wafers 20 is fixed to a first panel level substrate 10, and the wafer 20 includes a plurality of chips 201.

In the embodiment, the wafer 20 is fixed to the first panel level substrate 10 through a first adhesive layer 301.

In the step of S31, as shown in FIG. 3, re-distribution layers 40 are formed on the wafer 20 for each of the chips 201.

In the step of S32, as shown in FIG. 4, each individual chip 201 and the re-distribution layer 40 connected to the chip 201 are formed by cutting.

To avoid damaging the first panel level substrate 10 during the cutting to reuse the first panel level substrate 10, the first panel level substrate 10 may be removed first after S31 and before S32.

In the embodiment, an appropriate method may be selected according to the material of the first adhesive layer 301, to separate the first adhesive layer 301 from the chip 201, to remove the first panel level substrate 10.

The material of the first adhesive layer 301 may be, for example, a double-side adhesive. In this case, viscosity of the double-sided adhesive may be reduced by heating, to achieve separation from the chip 201, to remove the first panel level substrate 10. Alternatively, the material of the first adhesive layer 301 may be, for example, a UV adhesive glue. In this case, viscosity of the UV adhesive glue may be reduced by UV light, to achieve separation from the chip 201, to remove the first panel level substrate 10.

In the step of S33, as shown in FIG. 6, the chip 201 and the re-distribution layer 40 connected thereto are fixed to a second panel level substrate 50, and the re-distribution layer 40 is brought away from the second panel level substrate 50.

In the embodiment, the chip 201 and the re-distribution layer 40 connected thereto are fixed to the second panel level substrate 50 by the second adhesive layer 302.

The chip 201 fixed to the second panel level substrate 50 should be a qualified chip 201 after being tested.

In the step of S24, as shown in FIG. 8, the chip 201 is encapsulated, to form an encapsulating layer 60.

The material of the encapsulating layer 60 is preferably EMC.

Figure 15:
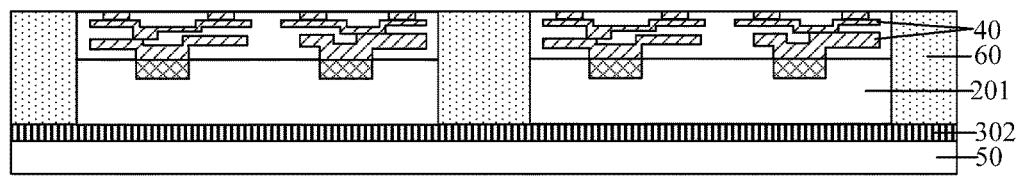
FIG. 15 is a schematic view of the encapsulating layer after being decapsulated on the basis of FIG. 8.

In step of S35, as shown in FIG. 15, the encapsulating layer 60 is decapsulated, to expose the contacting portion of the re-distribution layer 40 in contact with the solder ball 80.

Figure 16:
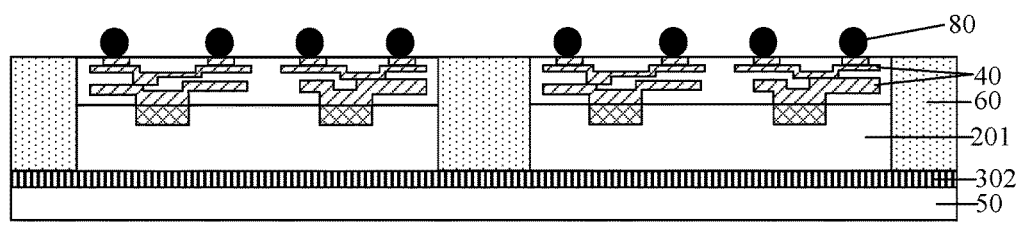
FIG. 16 is a schematic view of forming a solder ball on the basis of FIG. 15.

In the step of S36, as shown in FIG. 16, solder balls 80 are formed.

Figure 17:
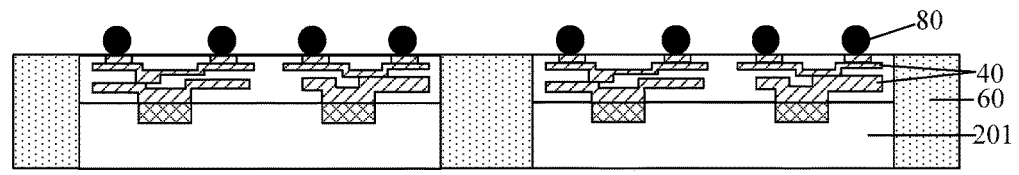
FIG. 17 is a schematic diagram after removing the second panel level substrate on the basis of FIG. 16.

In the step of S37, as shown in FIG. 17, the second panel level substrate 50 is removed.

The method of removing the second panel level substrate 50 is similar to that of removing the first panel level substrate 10, and details are not described herein again.

In the embodiment, after the second panel level substrate 50 is removed, the encapsulating layer 60 may be cut to obtain each individual encapsulated chip. The encapsulating layer 60 may also be cut first to obtain each individual encapsulated chip, and then the second panel level substrate 50 may be removed.

Based on the above, in an exemplary embodiment, a shape of the wafer 20 is a regular polygon; and a plurality of the wafers 20 is seamlessly arranged on the first panel level substrate 10.

In this way, the wafer 20 can be placed as many as possible on the first panel level substrate 10, to increase the utilization rate of the first panel level substrate 10, thereby further increasing the yield efficiency.

Figure 18:
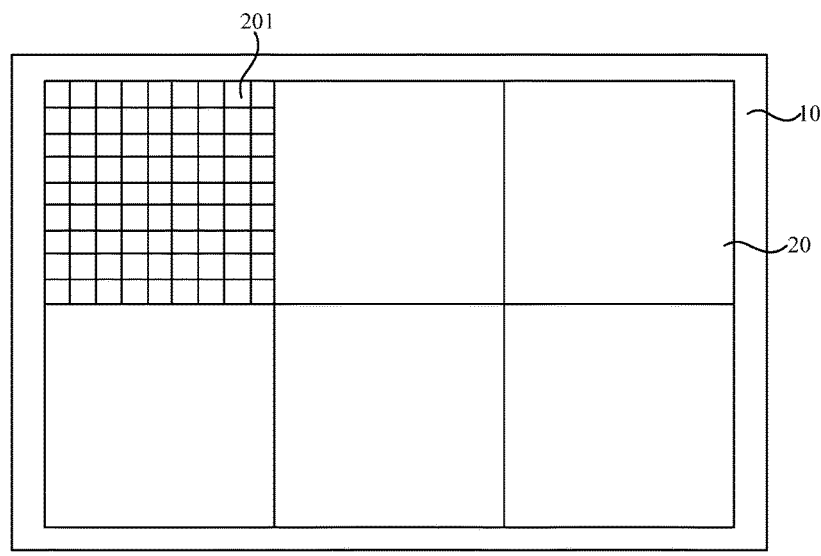
FIG. 18 is another schematic diagram of fixing a plurality of wafers to a first panel level substrate provided by the present disclosure.

In an exemplary embodiment, as shown in FIG. 18, the wafer 20 has a rectangular or regular hexagon shape, which may further increase the utilization rate of the first panel level substrate 10.

In an exemplary embodiment, the second panel level substrate 50 is a tempered glass substrate.

The stress of the encapsulating layer 60 is extremely large, and the bending resistance, impact resistance and resistance of the multilayer process of the tempered glass are strong. Therefore, it may avoid bending or even cracking problems of the second panel level substrate 50 due to its inability to withstand large stress, by serving the tempered glass substrate as the second panel level substrate 50.

In an exemplary embodiment, the first panel level substrate 10 and the second panel level substrate 50 have an identical size.

In an exemplary embodiment, the third panel level substrate 70 and the first panel level substrate 10, the second panel level substrate 50 have an identical size.

In this way, sharing can be performed during the actual process, thereby reducing costs.

The embodiment of the present disclosure also provides a chip encapsulating structure (as shown in FIG. 13 and FIG. 17), which can be prepared through any of the chip encapsulating methods described above.

The foregoing descriptions are merely specific implementation manners of the present disclosure, but the protection scope of the present disclosure is not limited thereto. Change or replacement easily thought of by any person skilled in the art within the technical scope disclosed by the present disclosure should be within the protection scope of the present disclosure. Therefore, the protection scope of the present disclosure should be based on the protection scope of the claims.

What is claimed is:

1. A chip encapsulating method, comprising:
    fixing a plurality of wafers to a first panel level substrate, a wafer comprising a plurality of chips;
    forming a re-distribution layer on the wafer for each of the chips;
    forming each individual chip and the re-distribution layer connected to the chip by cutting;
    fixing the chip and the re-distribution layer connected to the chip to a second panel level substrate; and
    encapsulating the chip to form an encapsulating layer.

2. The chip encapsulating method of claim 1, wherein when the chip and the re-distribution layer connected with the chip are fixed to the second panel level substrate, the re-distribution layer is close to the second panel level substrate;
    after the chip is encapsulated, the chip encapsulating method further comprises:
    removing the second panel level substrate;
    fixing the encapsulating layer to a third panel level substrate, and forming a solder ball on one side of the re-distribution layer.

3. The chip encapsulating method of claim 1, wherein when the chip and the re-distribution layer connected with the chip are fixed to the second panel level substrate, the re-distribution layer is close to the second panel level substrate;
    after the chip is encapsulated, the chip encapsulating method further comprises:
    cutting the encapsulating layer, to form each individual chip encapsulating body; and
    forming a solder ball for each of the chip encapsulating body.

4. The chip encapsulating method of claim 1, wherein when the chip and the re-distribution layer connected with the chip are fixed to the second panel level substrate, the re-distribution layer is away from the second panel level substrate;
    after the chip is encapsulated, the chip encapsulating method further comprises:
    decapsulating the encapsulating layer, to expose a contact portion of the re-distribution layer contacting a solder ball; and
    forming the solder ball.

5. The chip encapsulating method of claim 1, wherein after the re-distribution layer is formed and before forming each individual chip and the re-distribution layer connected to the chip by cutting, the method further comprises:
    removing the first panel level substrate.

6. The chip encapsulating method of claim 1, wherein a shape of the wafer is a regular polygon; and
    a plurality of the wafers is seamlessly arranged on the first panel level substrate.

7. The chip encapsulating method of claim 6, wherein the wafer has a rectangular or regular hexagon shape.

8. The chip encapsulating method of claim 1, wherein the second panel level substrate is a tempered glass substrate.

9. The chip encapsulating method of claim 1, wherein the first panel level substrate and the second panel level substrate have an identical size.

10. The chip encapsulating method of claim 2, wherein the first panel level substrate and the second panel level substrate have an identical size.

11. The chip encapsulating method of claim 3, wherein the first panel level substrate and the second panel level substrate have an identical size.

12. The chip encapsulating method of claim 4, wherein the first panel level substrate and the second panel level substrate have an identical size.

13. The chip encapsulating method of claim 9, wherein the third panel level substrate and the first panel level substrate, the second panel level substrate have an identical size when the encapsulating layer is fixed to the third panel level substrate.

14. The chip encapsulating method of claim 10, wherein the third panel level substrate and the first panel level substrate, the second panel level substrate have an identical size when the encapsulating layer is fixed to the third panel level substrate.

15. The chip encapsulating method of claim 11, wherein the third panel level substrate and the first panel level substrate, the second panel level substrate have an identical size when the encapsulating layer is fixed to the third panel level substrate.

16. A chip encapsulating structure, comprising:
   a plurality of wafers fixed to a first panel level substrate, a wafer comprising a plurality of chips;
   a re-distribution layer for each of the chips formed on the wafer;
   the plurality of chips being individual chips having the re-distribution layer connected to the chips; and
   the chip and the re-distribution layer connected to the chip being fixed to a second panel level substrate; wherein a shape of the wafer is a regular polygon; and a plurality of the wafers are seamlessly arranged on the first panel level substrate.

17. The chip encapsulating structure of claim 16, wherein the wafer has a rectangular or regular hexagon shape.

18. The chip encapsulating structure of claim 16, wherein the first panel level substrate and the second panel level substrate have an identical size.

* * * * *